United States Patent [19]

Schade, Jr.

[11] 4,004,244
[45] Jan. 18, 1977

[54] DYNAMIC CURRENT SUPPLY
[75] Inventor: Otto Heinrich Schade, Jr., N. Caldwell, N.J.
[73] Assignee: RCA Corporation, New York, N.Y.
[22] Filed: May 27, 1975
[21] Appl. No.: 581,045
[52] U.S. Cl. .................................. 330/22; 323/4; 330/19; 330/35
[51] Int. Cl.² .......................................... H03F 3/04
[58] Field of Search ............ 323/4; 330/19, 22, 32, 330/35

[56] References Cited
UNITED STATES PATENTS
3,894,290   7/1975   Schoeff .......................... 330/22 X Primary Examiner—Rudolph V. Rolinec
Assistant Examiner—Lawrence J. Dahl
Attorney, Agent, or Firm—H. Christoffersen; S. Cohen; K. Watov

[57] ABSTRACT

A dynamic current supply is connected between the emitter electrode of an output transistor and a point of reference potential, to progressively increase the magnitude of the flow of current therebetween, as the output signal at the emitter electrode approaches the point of reference potential. The dynamic current supply includes a current mirror, the output of which is in the path of and controls the flow of current. An MOS transistor, the conductivity of which is a function of the difference in potential between the operating voltage supplied to the output transistor and the output signal, supplies the input or control current to the current mirror.

20 Claims, 5 Drawing Figures

DYNAMIC CURRENT SUPPLY

The present invention relates generally to semiconductor amplifiers and more particularly to amplifiers which can produce an output signal at a level close to that of a voltage supply rail.

IN THE DRAWINGS

Figure 1:
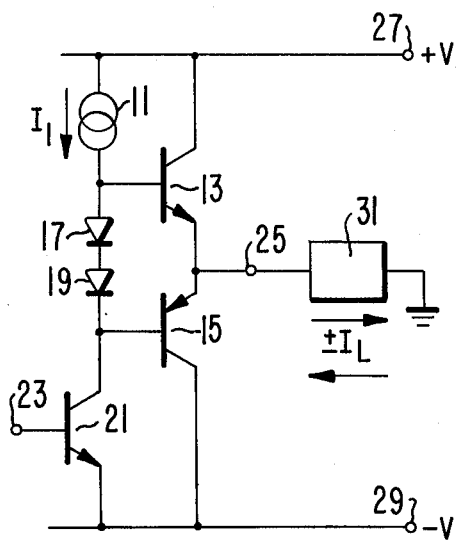
FIG. 1 is a simplified schematic diagram of a complementary emitter-follower output stage, of the prior art.

It is known in the prior art to use the complementary emitter-follower output stage of FIG. 1, for both "sourcing" and "sinking" load currents $\pm I_L$. Such an amplifier includes a current source 11, a pair of complementary output transistors 13, 15, a pair of bias diodes 17, 19, a signal amplifier transistor 21, input and output terminals 23, 25, respectively, and a pair of power terminals 27, 29, for connection to positive and negative operating voltages $\pm V$, respectively, all interconnected as shown. The current source 11 supplies operating current $I_1$ to both the bias diodes 17, 19 and the signal amplifier 21, which in turn provide bias and signal currents for operating the output transistors 13, 15. The output transistors 13, 15 are capable of providing an output signal to a load 31; the output signal potential can swing to within ($V_{be}$ of transistor 15 + $V_{sat}$ of transistor 21) of the operating potentials $+V$, $-V$ at either extreme, in tracking an input signal applied to input 23, where $V_{be}$ is the base-emitter voltage drop and $V_{sat}$ is the collector-emitter voltage during saturation of the transistor.

Figure 3:
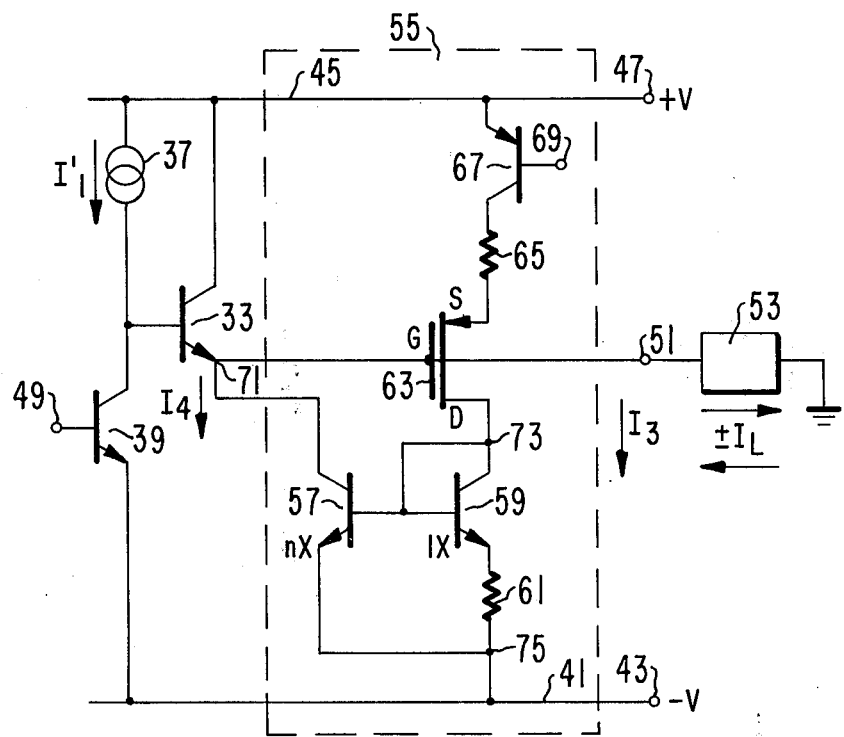
FIG. 3 is a schematic diagram of an amplifier incorporating one embodiment of the dynamic current supply, i.e. negative supply or sink of the present invention.
Figure 4:
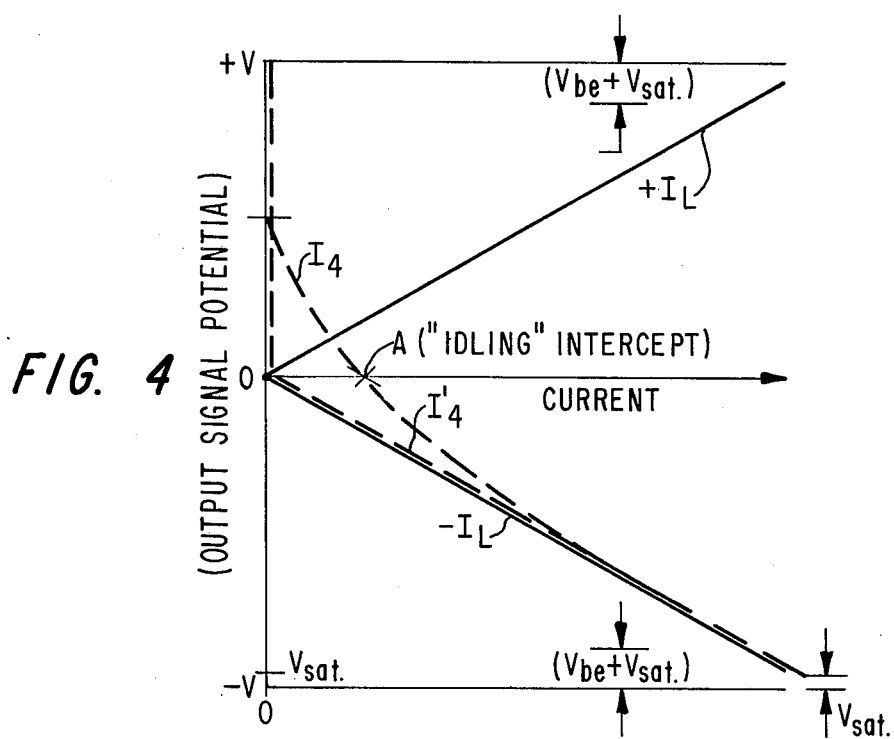
FIG. 4 is a curve showing the relationship of the amplitude of the output signal to various load, bias, and control currents of the amplifiers illustrated.

The load current, $\pm I_L$ is shown in FIG. 4, in relation to the output signal potential. Output transistor 13 provides the current source for applying $+I_L$ to the load 31; output transistor 15 provides the current sink for applying $-I_L$ to the load 31. The geometries of transconductance ratios of the bias diodes are chosen to produce a small idling current through the output transistors 13, 15 to minimize "crossover" distortion. This amplifier circuit, as well as the amplifier circuits of FIGS. 2, 3 and 5, can be in integrated or discrete circuit form.

Figure 2:
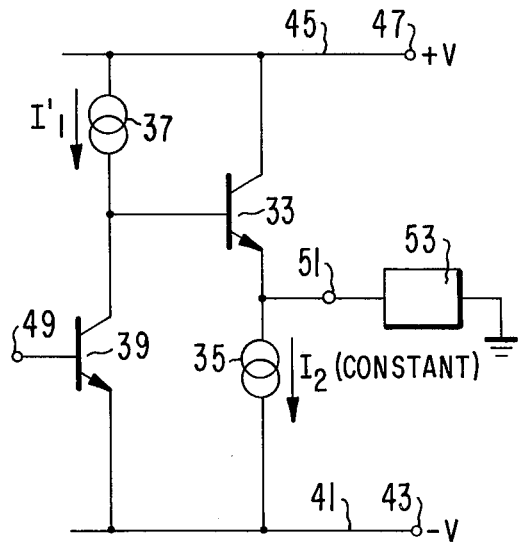
FIG. 2 is a simplified schematic diagram of a Class A amplifier stage of the prior art, permitting signal tracking to within $V_{sat}$ above the negative rail.

When its necessary, for example, to sink current to closer than ($V_{be} + V_{sat}$) of an operating potential $-V$ (negative rail in an integrated circuit) or when the frequency limitations of a monolithic PNP lateral output transistor cannot be tolerated, the complementary emitter-follower output stage cannot be used. For such a requirement, it is known in the prior art to employ a Class A output stage such as shown in FIG. 2. This output stage includes an NPN emitter-follower output transistor 33 connected to a sink 35 of constant current $I_2$ and output terminal 51. The current source 37 provides an operating current $I'_1$ for signal amplifier transistor 39, and a biasing current for output transistor 33.

Current sink 35 can be operated to within $V_{sat}$ above the negative rail 41, that is, $V_{sat}$ above the operating potential $-V$ applied to power terminal 43.

A positive operating voltage $+V$ is applied to positive rail 45 via power terminal 47. Input signals are applied to input terminal 49, and a load 53 is connected between output terminal 51 and a point of reference potential, ground in this case.

Although this circuit overcomes the signal tracking and frequency limitations of the complementary emitter-follower output stage of FIG. 1, it has an inherent disadvantage that the power consumption can be excessive. Current sink 35 draws a constant amount of current having a magnitude substantially equal to the maximum expected load current. In some designs this current $I_2$ must be relatively high, and in such designs there is excessive power consumption.

The present inventor recognized that the circuit performance could be improved in the respect discussed above, if the current sink or supply 35 were made variable. The current sink 35 rather than withdrawing a constant current, would withdraw only as much as required to provide an output signal at the desired voltage level. In other words, the sink 35 would become operative only at such times that the polarity of the output signal became negative, and would withdraw only enough current $I_2$ to ensure that the output signal at terminal 51 were at the required negative value. Looked at another way, the magnitude of the sink current of current sink 35 would be made a function of the polarity and amplitude of the output signal at any given time. The current curve $I'_4$, shown in FIG. 4, illustrates this desired characteristic. The impedance of load 53 must, of course, be considered in determining the required values of magnitude of sink currents $I'_4$, required for maintaining a desired range of amplitudes of an output signal.

A circuit operating on this principle is illustrated in FIG. 3. The circuit is similar to the one of FIG. 2; however, the current supply 35 is replaced by a "dynamic" current supply 55. The latter includes an NPN transistor 57 having a collector electrode connected to the common connection 71 of the emitter electrode of output transistor 33, the gate electrode of PMOS transistor 63, and output terminal 51. The emitter electrode of transistor 57 is connected to power terminal 43, and its base electrode is connected to the base electrode of another NPN transistor 59. NPN transistor 59 also has its base electrode connected to its collector electrode, and its emitter electrode coupled via a scaling resistor 61 to the negative rail 41. A PMOS transistor 63 is connected at its drain electrode to the collector electrode of NPN transistor 59, and at its source electrode via a load resistor 65 to the collector electrode of a PNP switching transistor 67. The PNP switching transistor 67 is connected at its emitter electrode to the positive rail 45, and at its base electrode to a bias terminal 69.

NPN transistors 57 and 59 form a current mirror, having an output terminal 71, an input terminal 73, and a common terminal 75. The product of the magnitude of the input current $I_3$ times the mirror ratio determines the magnitude of the output or sink current $I_4$. The input current $I_3$ may be thought of as a control current for the current mirror 57, 59. The magnitude of $I_3$ is determined by the potential difference between the operating voltage $+V$ and the output signal voltage appearing at terminal 51, and the value of load resistor

65. This potential difference minus the voltage drop across load resistor 65 determines the gate-source potential of PMOS transistor 63, and thus the conductivity of this transistor 63 and the magnitude of $I_3$, which is the source-drain current of the PMOS transistor 63.

In operation, when it is desired to turn on the dynamic current supply 55, switching signal is applied to bias or control terminal 69, of sufficient amplitude to saturate switching transistor 67, thereby connecting resistor 65 to the positive rail 45. The use of switching transistor 67 permits the dynamic current source 55 to be turned on and off selectively or programmably. Assume that positive and negative going signals are applied to input terminal 49. As shown in the curves of FIG. 4, the amplifier is balanced to provide a zero potential output signal at output terminal 51, whenever a quiescent input signal is applied to input terminal 49. At such times, the magnitude of the control current $I_3$ will be such as to cause the output or sink current $I_4$ of the current mirror 57, 59 to be equal to some value $I_A$ (the value at point A on the graph). If the output signal increases in value (becomes more positive), due to a drop in amplitude of the input signal, the output or sink current $I_4$ will decrease in magnitude. The increased potential at the gate electrode of PMOS transistor 63 causes a decrease in its source-drain current $I_3$, which is the input current to the current mirror. As a result $I_4$, the output current of the mirror, also decreases. Thus, as contrasted to the prior art FIG. 2, where $I_2$ is a constant, here $I_3$ and $I_4$ are variable and as the input signal decreases in value, these two currents also decrease in value. On the other hand, when the input signal at terminal 49 becomes more positive, the output signal will become more negative. This results in increased source-drain current flow through PMOS transistor 63, that is increased input current $I_3$ to the current mirror 57, 59. This, in turn, means increased output current $I_4$ through the current mirror and a drop in the voltage between node 71 and common terminal 43, that is, a decrease in the impedance and therefore of the voltage between output terminal 51 and the negative rail 41. At the limit, the output voltage can come within $V_{sat.}$ of transistor 57 of the negative rail 41 or operating voltage $-V$, provided that $I_4 < -I_L$. Transistor 57 permits sinking of the output signal to swing negatively to within $V_{sat.}$ of $-V$, regardless of whether single or dual power supplies are used.

The mirror ratio n of the current mirror transistors 57, 59 is made greater than 1 to reduce the magnitude of control current $I_3$ required to produce a desired output or sink current $I_4$. Also, the scaling resistor 61 may be included to further increase the value of the mirror ratio, depending upon the value of scaling resistor 61. In this manner, the power efficiency of the dynamic current supply is increased by reducing the power dissipation in those elements through which control current $I_3$ flows. For example, if the total mirror ratio with the scaling resistor is equal to 8, then for a given magnitude of $I_3$, the magnitude of $I_4$ will be 8 times greater. Obviously, for positive-going excursions of the output signal, the output signal can go to within $V_{be}$ plus $V_{sat.}$ of the positive rail 45 or operating voltage $+V$, the $V_{sat.}$ value being that of current source 37.

The efficiency of the dynamic sink or supply 55 can be further improved, if the output or sink current $I_4$ could be made zero for positive going output signal potentials. The ideal characteristic for the output current $I_4$, is the current curve $I'_4$ shown in FIG. 4.

In a preferred embodiment of the invention, the load resistor 65 is returned to a bias potential that is less positive than the operating voltage $+V$, required to attain desired magnitudes for the output or sink current $I_4$.

Figure 5:
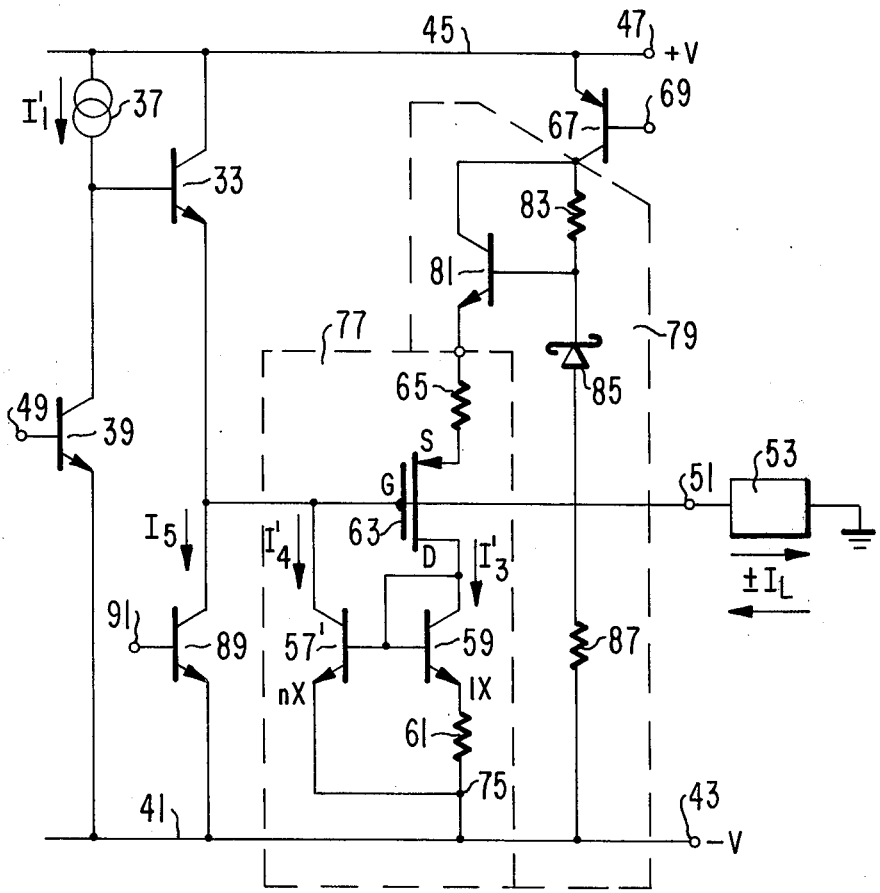
FIG. 5 is a schematic diagram of an amplifier incorporating a preferred embodiment of the dynamic current supply.

In the circuit of FIG. 5, the dynamic current sink or supply 77 includes a circuit 79 in addition to what is present in FIG. 3 to provide such a bias potential. The dynamic current supply 77 is similar to the dynamic current supply 55 of FIG. 3, except that the connection between the load resistor 65 and the collector electrode of switching transistor 67, has been opened and the bias potential circuit 79 coupled between these points. The bias potential network or circuit 79 includes an NPN emitter-follower transistor 81 having an emitter electrode connected to one end of load resistor 65, a collector electrode connected to the collector electrode of switching transistor 67, and a base electrode connected to one end of a resistor 83, the other end of which is connected to the common connection of the collector electrodes of transistors 81 and 67. A Zener diode 85 has a cathode electrode connected to the common connection of resistor 83 and the base electrode of transistor 81, and an anode electrode connected to one end of another resistor 87, the other end of which is connected to the negative rail 41. The values of resistors 83 and 87, and Zener diode 85 are chosen to provide a desired bias potential or operating voltage at the common connection of load resistor 65 and the emitter electrode of transistor 81. This value usually is substantially lower than the operating voltage $+V$. Emitter-follower transistor 81 is included to prevent loading of the voltage reference circuit including the Zener diode 85, and resistors 83 and 87.

With such an operating or bias voltage supplied to the dynamic current supply 77 from the bias potential network 79, a control current $I'_3$ will be supplied to the current mirror 57, 59, providing an output current $I'_4$. As previously mentioned and shown in FIG. 4, the resultant output or sink current $I'_4$ is preferred, for enhancing the power efficiency, and has the characteristic shown with relation to the output signal potential. Switching transistor 67 is operated to couple the operating voltage $+V$ to the bias or reference voltage network 79, for energizing the dynamic current supply 77.

When the values of the operating voltage $+V$ and reference potential $-V$ decrease to values at which the dynamic current supply 77 becomes inoperative, it is desirable to include additional circuitry to provide at least a minimal sink current for output transistor 33 at such times. This minimal sink current is provided by NPN transistor 89, having a collector electrode connected to the emitter electrode of output transistor 33, an emitter electrode connected to the negative rail 41, and a base electrode connected to a bias terminal 91. A DC bias is applied to terminal 91, establishing a minimum sink current, in applications requiring such a provision. In applications not requiring a minimum sink current, or where it is unlikely that the operating reference voltages $+V$ and $-V$ could decrease to values rendering the dynamic current supply 77 inoperative, bias terminal 91 would merely be connected to ground or left floating (or transistor 89 removed).

The dynamic current supply 77 is designed to draw more current than required by the load. The excess ($I'_4 + I_5 - I_L$) will then be supplied by output transistor 33. This approach avoids instabilities which can occur in some quasicomplementary amplifiers, due to phase shift in feedback signals. In the invention, phase shift of $I'_4$ is of no consequence, so long as the instantaneous value of sink current exceeds the load demand.

Assume that switching transistor 67 has been saturated by the application of a switching voltage to its base electrode 69. If, for example, resistors 83 and 87 are made 15k ohms and 20k ohms, respectively, and Zener diode 85 is an 8 volt Zener, about 0.628 milliamperes will flow through this series circuit, if terminals 47 and 43 are at +15 volts and −15 volts, respectively. Under these conditions, about +5.6 volts will be supplied to the base electrode of transistor 81, resulting in a +5 volts potential at the common connection between load resistor 65 and the emitter electrode of transistor 81, assuming there is about a 0.6 volt drop across the base-emitter junction of transistor 81. If the quiescent signal is applied to input terminal 49, load resistor 65 is 12k ohms, and scaling resistor 61 is 30 ohms, then for a zero volt output signal at output terminal 51, about 180 microamperes will flow through the current path including the collector-emitter electrodes of transistor 81, resistor 65, the source-drain electrodes of PMOS 63, and the collector-emitter electrodes of transistor 59. Such a current flow will cause a drop of 2.6 volts across load resistor 65, and a voltage drop across the gate-source electrodes of transistor 63 of about 2.4 volts, resulting in a zero volt output signal at outputterminal 51. Under these conditions, the mirror or load current $I'_4$ will be about 600 microamperes, which represents the idling intercept for $I'_4$ (see FIG. 4). Ideally, $I'_4$ could approach a zero-current idling intercept as in FIG. 4, but this is difficult to control in practice. If the circuit of FIG. 3 had the same values as given in this example, it can be shown that the idling current intercept A, for $I_4$, would be about 3.6 milliamperes. Therefore, the FIG. 5 circuit has been output terminal over the FIG. 3 circuit by a factor of six, as to the idling current intercept approaching the ideal value of zero.

Assuming values for FIG. 5 as given in the preceeding paragraph, if the output signal swings to within $V_{sat}$ of the −15 volts reference potential, the load current, that is $I'_4$, must be about 7.5 milliamperes for a (commonly-used) 2k ohm load. The dynamic current source 77 will ensure such a magnitude of current flow. The prior art circuit of FIG. 2, to also ensure such a current flow, must provide a magnitude of current $I_2$ of about 7.5 milliamperes at all times, even when the output signal at output terminal 51 is positive. Even with the circuit 79 added to the dynamic current supply 77, it can be seen that this combination is far more efficient than the prior art circuit of FIG. 2. With a zero volt output signal at terminal 51, this combination draws only about 1.408 milliamperes total current. Therefore, for the circuit parameters given in the example, the circuit of FIG. 5 is at least 5 times more efficient than the prior art circuit of FIG. 2.

It is preferred that a PMOS transistor 63 be used in the dynamic current supplies 55, 77, both because of such devices wideband capabilities and the ability to operate with a drain-source potential 1 $V_{be}$ less than gate-source potential, allowing the output signal to go to the negative rail 41. However, a PNP transistor could be used in place of the PMOS transistor 63. It should also be noted that if the complementary version of the amplifier output stage circuits of FIGS. 3 or 5 were employed, complementary dynamic current supplies of the embodiments of the present invention could be employed to permit the output signal of such complementary versions to approach within $V_{sat}$ of the positive rail.

What is claimed is:
1. In combination:
 a power terminal for receiving an operating voltage;
 a reference terminal for receiving a reference voltage;
 an input terminal;
 an output terminal;
 an output transistor having a collector electrode connected to said power terminal, a base electrode coupled to said input terminal, and an emitter electrode connected to said output terminal;
 a controlled-current-supply transistor having a principal conduction path between a first electrode thereof and a second electrode thereof, the conductivity of said path being directly related to the potential between said first electrode and a third electrode of said controlled-current-supply transistor, the first and second electrodes of said controlled-current-supply transistor being connected respectively to said reference terminal and to said output terminal; and
 means for sensing the potential appearing at said output terminal to generate a control signal applied between the first and third electrodes of said controlled-current-supply transistor to increase its conduction as the potential between said reference terminal and said output terminal decreases in value.

2. The combination of claim 1, wherein said controlled-current-supply transistor has a direct current conductive connection between its first and third electrodes which includes a semiconductor diode means.

3. The combination of claim 2 wherein said means for sensing the potential appearing at said output terminal includes:
 a first resistor;
 an MOS transistor having a gate electrode connected to said emitter electrode, a drain electrode connected to the third electrode of said controlled-current-supply transistor, and a source electrode connected to one end of said first resistor, the other end of which is coupled to said power terminal.

4. The combination of claim 3 further including:
 switching means connected between the other end of said first resistor and said power terminal, responsive to a switching signal, for selectively connecting and disconnecting said operating voltage from said first resistor.

5. The combination of claim 2, wherein said means for sensing the potential appearing at said output terminal includes:
 a first resistor;
 an MOS transistor having a gate electrode connected to said emitter electrode, a drain electrode connected to the third electrode of said controlled-current-supply transistor, and a source electrode connected to one end of said first resistor;
 bias potential supply means coupled between said power terminal and said reference terminal, for providing a bias voltage to the other end of said first resistor, the amplitude and polarity of said bias voltage being such that for one polarity of said output signal substantially no control current will flow, whereas for an opposite polarity of said output signal a control current will flow having a magnitude determined by the value of said first resistor and the difference between said bias voltage and the potential at said output terminal.

6. The combination of claim 2, wherein said semiconductor diode means comprises a self-biased transistor.

7. The combination of claim 2, wherein said direct-current-conductive connection between the first and third electrodes of said controlled-current-supply transistor includes a resistor in series connection with said semiconductor diode means.

8. The combination of claim 5, wherein said bias potential supply means includes:
second and third resistors;
an emitter-follower transistor having a collector electrode coupled to said power terminal, an emitter electrode connected to the and of said first resistor remote from the source electrode of said MOS transistor, and a base electrode connected to a first end of said second resistor, the second end of which is coupled to said power terminal; and
a diode poled for reverse conduction in a connection between the base electrode of said emitter-follower transistor and one end of said third resistor, the other end of which is connected to said reference terminal, the amplitude of said bias potential being determined by the breakdown voltage of said diode poled for reverse conduction and the resistances of said second and said third resistors.

9. The combination of claim 8 including:
switching means connected between the second end of said second resistor and said power terminal, responsive to a switching signal, for selectively applying and removing said operating voltage from said bias potential means.

10. The combination of claim 5, which further includes:
a pull-down transistor having a collector electrode connected to the emitter electrode of said output transistor, an emitter electrode connected to said reference terminal, and a base electrode; and
a bias voltage connected across the base-emitter electrodes of said pull-down transistor, of such value to ensure a predetermined minimum magnitude of current flow between said reference terminal and the emitter electrode of said output transistor.

11. An amplifier comprising, in combination:
first and second terminals for an operating voltage source;
a transistor having base, emitter and collector electrodes, connected at its collector electrode to the first of said terminals;
controllable impedance means coupling said emitter electrode to said second terminal, further including means responsive to the voltage at said emitter electrode, when it approaches the voltage at said second terminal, for reducing the impedance of said controllable impedance means between said emitter electrode and said second terminal to a value such that the voltage between said two terminals reduces to lower than $1V_{be}$, $1V_{be}$ being the voltage between the base and emitter electrodes of a transistor which is necessary to support conduction through the transistor.

12. An amplifier as set forth in claim 11, wherein said means responsive to the voltage at said emitter electrode comprises an input current path of a current mirror amplifier, and said controllable impedance means comprises an output current path of said current mirror amplifier, and comprises further, means for supplying an amount of input current to said input current path as a function of the voltage at said emitter electrode.

13. An amplifier as set forth in claim 12, wherein said output current path comprises the emitter-to-collector path of a transistor whereby, in the limit, the voltage between said emitter electrode and said second terminal can reduce to $V_{sat}$, the voltage between the emitter and collector electrodes of this transistor, at saturation.

14. An amplifier as set forth in claim 12, wherein said means responsive to voltage further includes means for reducing to substantially zero the flow of current through said output current path when the voltage at said emitter electrode is at a particular value between the voltages at said first and second terminals.

15. An amplifier comprising, in combination:
first and second terminals between which an operating voltage may be applied;
a signal input terminal;
a signal output terminal;
an output transistor having a collector electrode connected to said first terminal, a base electrode coupled to said input terminal, and an emitter electrode connected to said output terminal;
solid-state means having a current path connected between said emitter electrode and said second terminal, and a control electrode receptive of a control signal for controlling the impedance of said current path; and
means coupled to said output terminal, to said second terminal, and to said control electrode, responsive to an output signal at said output terminal, for applying a control signal to said control electrode, for reducing the impedance of said current path, as the output signal amplitude approaches the voltage level at said second terminal.

16. The amplifier of claim 15, further including: a current mirror amplifier having input, output and common terminals, said common terminal being connected to said second terminal, an input current path between said input and common terminals and an output current path between said output and common terminals; and voltage sensing means coupled to said input current path for controlling the current passing through said input current path, said means coupled to said output terminal comprising said voltage sensing means and said input current path of said current mirror amplifier, and said solid state means comprising said output current path of said current mirror amplifier.

17. The amplifier of claim 16, wherein said voltage sensing means includes a MOS transistor having a source electrode coupled to said first terminal, a gate electrode connected to said output terminal, and a drain electrode connected to said input terminal of said current mirror amplifier.

18. The amplifier of claim 15, wherein said solid-state means comprises a transistor having emitter, base and collector electrodes, said current path comprising the collector-to-emitter path of said transistor, and said control electrode comprising said base electrode.

19. The amplifier of claim 16, wherein said current mirror amplifier includes:
a first transistor having a collector electrode connected to the output terminal of said current mirror amplifier, an emitter electrode connected to said common terminal of said current mirror amplifier, and a base electrode; and a second transistor having a base electrode and a collector electrode connected in common to the base electrode of said first transistor and to the input terminal of said current mirror amplifier, and an emitter electrode coupled to said common terminal of said current mirror amplifier.

20. The amplifier of claim 15, further including:

a second transistor, said second transistor including a collector electrode connected to the emitter electrode of said output transistor, an emitter electrode connected to said second terminal and a base electrode to which a bias voltage may be applied.

* * * * *

UNITED STATES PATENT OFFICE
CERTIFICATE OF CORRECTION

PATENT NO. : 4,004,244

DATED : January 18, 1977

INVENTOR(S) : Otto Heinrich Schade, Jr.

It is certified that error appears in the above-identified patent and that said Letters Patent are hereby corrected as shown below:

Column 2, line 33, after "characteristic" insert a period.

Column 3, line 44, "<" should read --$\leq$--.

Column 5, line 26, insert a space between "output" and "terminal".

Column 5, lines 36-37, "output terminal" should read --improved--.

*Signed and Sealed this*

*Fifth* Day of *April 1977*

[SEAL]

*Attest:*

RUTH C. MASON
*Attesting Officer*

C. MARSHALL DANN
*Commissioner of Patents and Trademarks*